(12) United States Patent
Adachi et al.

(10) Patent No.: US 10,965,098 B2
(45) Date of Patent: Mar. 30, 2021

(54) TRANSMITTER OPTICAL SUBASSEMBLY AND OPTICAL MODULE COMPRISING AN IMPEDANCE ELEMENT TO MINIMIZE A FLOW OF AN ALTERNATE CURRENT

(71) Applicant: Lumentum Japan, Inc., Kanagawa (JP)

(72) Inventors: Koichiro Adachi, Tokyo (JP); Yasunobu Matsuoka, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 270 days.

(21) Appl. No.: 16/243,107

(22) Filed: Jan. 9, 2019

(65) Prior Publication Data

US 2019/0237934 A1  Aug. 1, 2019

(30) Foreign Application Priority Data

Jan. 31, 2018  (JP) .............................. JP2018-014581

(51) Int. Cl.

| | |
|---|---|
| *H01S 5/026* | (2006.01) |
| *H01S 5/042* | (2006.01) |
| *H01S 5/12* | (2021.01) |
| *H04B 10/50* | (2013.01) |
| *H04B 10/61* | (2013.01) |

(Continued)

(52) U.S. Cl.
CPC .............. *H01S 5/042* (2013.01); *H01S 5/026* (2013.01); *H01S 5/12* (2013.01); *H04B 10/505* (2013.01); *G02B 6/4204* (2013.01); *G02B 6/4246* (2013.01); *G02B 6/4281* (2013.01); *H01S 5/02236* (2013.01); *H04B 10/61* (2013.01)

(58) Field of Classification Search
CPC .. G02B 6/4204; G02B 6/4246; G02B 6/4281; H01S 5/026; H01S 5/0265; H01S 5/042; H01S 5/12; H04B 10/40; H04B 10/505; H04B 10/61; H04N 9/3161
USPC ...................................................... 250/214 R
See application file for complete search history.

(56) References Cited

U.S. PATENT DOCUMENTS

| | | | |
|---|---|---|---|
| 4,426,704 A | * | 1/1984 | Nagai ..................... H01L 27/15 |
| | | | 257/E27.12 |
| 6,044,097 A | | 3/2000 | Kawamura et al. |
| 2012/0183306 A1 | | 7/2012 | Inoue |

FOREIGN PATENT DOCUMENTS

| | | |
|---|---|---|
| JP | 07-074420 A | 3/1995 |
| JP | 2012-151244 A | 8/2012 |

\* cited by examiner

*Primary Examiner* — Que Tan Le
(74) *Attorney, Agent, or Firm* — Harrity & Harrity, LLP

(57) ABSTRACT

A modulator integrated laser has a laser portion for emitting light and a modulation portion for modulating the light by an electric field absorption effect. The modulator integrated laser has a semiconductor substrate of a conductivity type in which the laser portion and the modulation portion are integrated. An impedance element with inductance and capacitance connected in parallel. The impedance element has a self-resonant characteristic exhibiting the highest impedance at a self-resonant frequency. The laser portion has first and second electrodes for a direct current voltage to be applied therebetween. The modulation portion has third and fourth electrodes for an alternate current voltage to be applied therebetween. The second electrode and the fourth electrode are electrically connected to each other through the semiconductor substrate. The impedance element is connected in series to the first electrode to minimize a flow of an alternate current.

10 Claims, 14 Drawing Sheets

(51) Int. Cl.
*G02B 6/42* (2006.01)
*H01S 5/022* (2021.01)

TRANSMITTER OPTICAL SUBASSEMBLY AND OPTICAL MODULE COMPRISING AN IMPEDANCE ELEMENT TO MINIMIZE A FLOW OF AN ALTERNATE CURRENT

CROSS-REFERENCE TO RELATED APPLICATION

The present application claims priority from Japanese application JP2018-14581 filed on Jan. 31, 2018, the content of which is hereby incorporated by reference into this application.

BACKGROUND

1. Field

This relates to transmitter optical subassemblies and optical modules.

2. Description of the Related Art

One of known light sources for optical communication is an EA (electro-absorption) modulator integrated DFB (distributed feedback) laser including a DFB laser and an EA modulator integrated on the same semiconductor substrate (JP H07-074420A, JP 2012-151244A). The EA modulator integrated DFB laser has a conductive semiconductor substrate with an electrode (e.g. cathode) common to a laser portion and a modulation portion. The laser portion should be designed to emit continuous wave light (CW light) generated by a direct current by means of applying a direct current voltage. The modulation portion is designed to modulate the CW light for generating high frequency optical signals, by changing an absorption rate of light, based on a high frequency voltage applied thereto.

The voltage applied to the modulation portion includes high frequency components going into the laser portion where the direct current voltage is applied, affecting an impact on its characteristic. Recently, some have been studying to operate the modulation portion by differential drive, to diminish amplitude of the high frequency voltage. The differential drive changes potential of the electrode (e.g. cathode) that is in the laser portion and is common to the modulation portion, having a larger impact on output of the laser portion, making it likely to deteriorate an optical characteristic.

SUMMARY

This is to aim at minimizing an impact on a laser portion due to high frequency components of voltage applied to a modulation portion.

(1) A transmitter optical subassembly may include a modulator integrated laser having a laser portion for emitting light and a modulation portion for modulating the light by an electric field absorption effect, the modulator integrated laser having a semiconductor substrate of a conductivity type in which the laser portion and the modulation portion are integrated; and an impedance element with inductance and capacitance connected in parallel, the impedance element having a self-resonant characteristic exhibiting the highest impedance at a self-resonant frequency. The laser portion has a first electrode and a second electrode for a direct current voltage to be applied therebetween. The modulation portion has a third electrode and a fourth electrode for an alternate current voltage to be applied therebetween. The second electrode and the fourth electrode are electrically connected to each other through the semiconductor substrate. The impedance element is connected in series to the first electrode to minimize a flow of an alternate current.

This can minimize an impact on a laser portion specifically from high frequency components, included in voltage applied to a modulation portion, at self-resonant frequency of an impedance element.

(2) In the transmitter optical subassembly according to (1), the laser portion has a characteristic exhibiting the highest emission intensity at a relaxation oscillation frequency, and the self-resonant frequency and the relaxation oscillation frequency make a difference of 10% or less of the self-resonant frequency.

(3) The transmitter optical subassembly according to (1) or (2) may further include a pair of traces for a differential transmission line. The third electrode and the fourth electrode are connected to the pair of respective traces.

(4) The transmitter optical subassembly according to any one of (1) to (3) may further include a bypass condenser connected in parallel to the laser portion.

(5) In the transmitter optical subassembly according to anyone of (1) to (4), the impedance element has first resistance connected in parallel to each of the inductance and the capacitance, and the impedance element has second resistance connected in series to the inductance.

(6) In the transmitter optical subassembly according to any one of (1) to (5), the impedance element consists of some components.

(7) The transmitter optical subassembly according to any one of (1) to (6) may further include a submount. The modulator integrated laser and the impedance element are mounted on the submount.

(8) An optical module may include the transmitter optical subassembly according to any one of (1) to (7); and a receiver optical subassembly.

(9) An optical module may include the transmitter optical subassembly according to any one of (1) to (6); a printed circuit board; and a receiver optical subassembly. At least a part of the impedance element is mounted on the printed circuit board.

(10) The optical module according to (9) may further include a flexible printed circuit board connected to the printed circuit board. The flexible printed circuit board is electrically connected to the modulator integrated laser.

DETAILED DESCRIPTION

Hereinafter, some embodiments will be described with reference to drawings, where the same element or an equivalent element bears the same reference number and repetitive description thereof will be omitted.

First Embodiment

Figure 1:
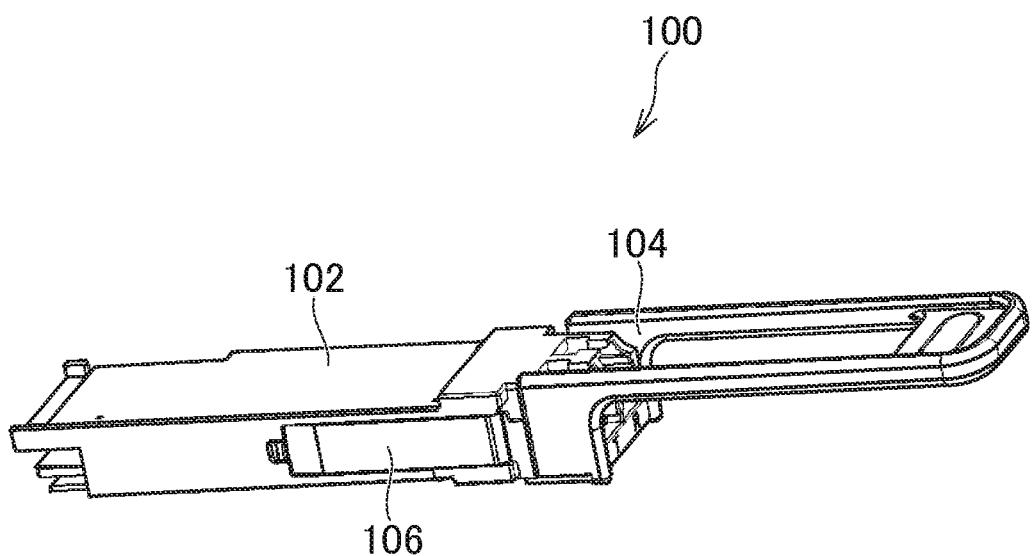
FIG. 1 is a perspective view of an optical module in a first embodiment.

FIG. 1 is a perspective view of an optical module in a first embodiment. The optical module 100 is an optical transmitter and receiver (optical transceiver) with a bit rate of 100-Gbit/s-class, including an optical transmitting function and an optical receiving function, based on MSA (Multi-Source Agreement) standards of QSFP28 (Quad Small Form-factor Pluggable 28). The optical module 100 has an outer configuration consisting of components such as a case 102, a pull-tab 104, and a slider 106.

Figure 2:
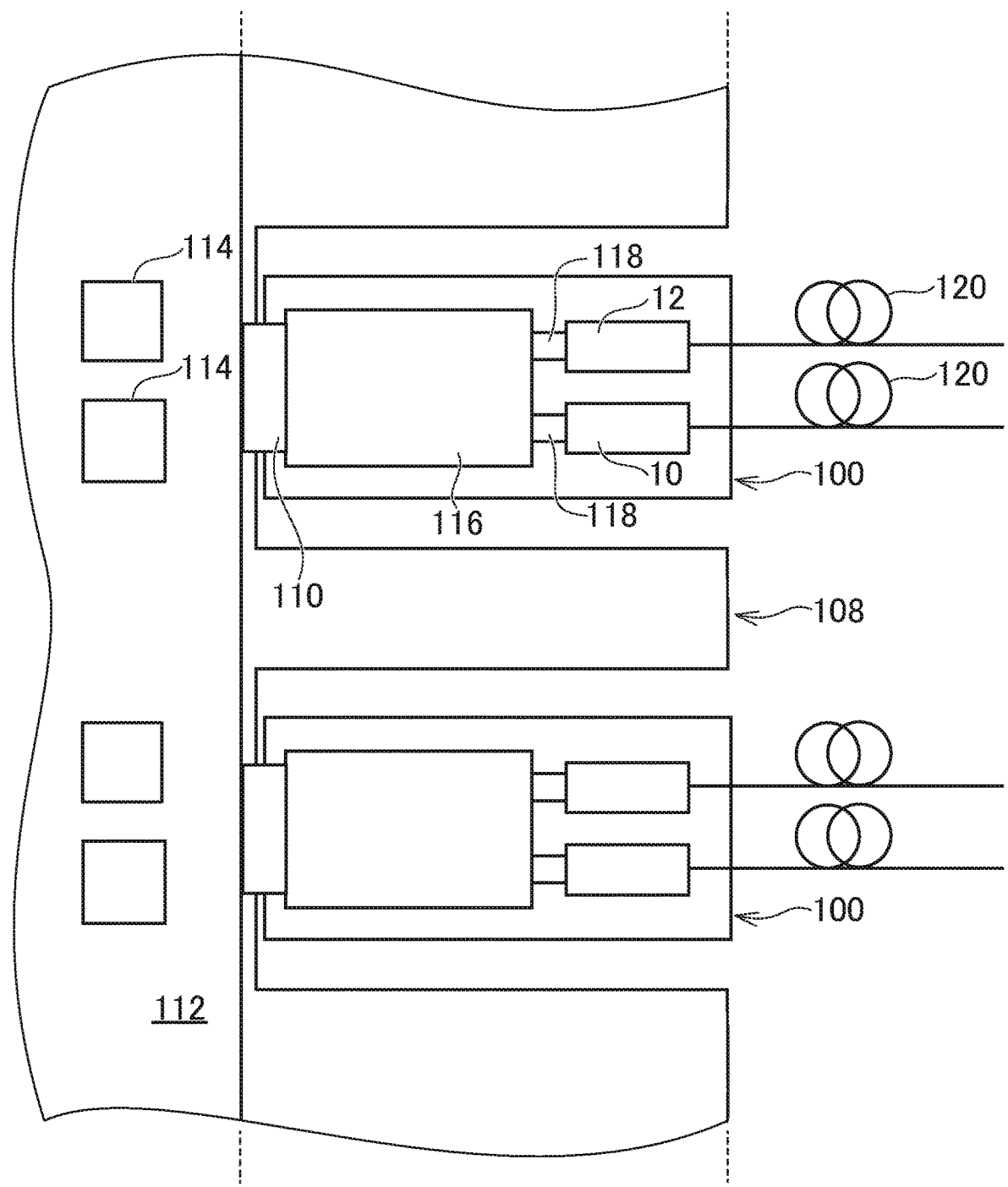
FIG. 2 is a schematic view of configuration of an optical transmission equipment to which the optical module in the first embodiment is attached.

FIG. 2 is a schematic view of configuration of the optical transmission equipment 108 to which the optical module 100 in the first embodiment is attached. Some optical modules 100 are attached to the optical transmission equipment 108 through respective electric ports 110. The optical transmission equipment 108 may be a large-capacity router or a switch. The optical transmission equipment 108 may have an exchange function and be placed in a base station. The optical transmission equipment 108 may be configured to receive a reception data (incoming electric signals) from one of the optical modules 100, determine where to transmit which data with an integrated circuit chip 114 on a circuit substrate 112, generate transmission data (outgoing electric signals), and transmit the data to a corresponding one of the optical modules 100.

The optical module 100 is equipped with a printed circuit board 116, a flexible printed circuit board 118, a transmitter optical subassembly 10 for converting electric signals into optical signals, and a receiver optical subassembly 12 for converting other optical signals into other electric signals. The transmitter optical subassembly 10 includes a photoelectric conversion element, which is a light-emitting element for converting the electric signals into the optical signals. The receiver optical subassembly 12 includes another photoelectric conversion element, which is a light-receiving element for converting the optical signals into the electric signals. For inputting/outputting the optical signals, the transmitter optical subassembly 10 and the receiver optical subassembly 12 are connected to respective optical fibers 120.

The printed circuit board 116 is a rigid substrate without flexibility. The printed circuit board 116 is connected to each of the transmitter optical subassembly 10 and the receiver optical subassembly 12 through the respective flexible printed circuit board 118. Electric signals are transmitted from the printed circuit board 116, through the flexible printed circuit board 118, to the transmitter optical subassembly 10. Other electric signals are transmitted from the receiver optical subassembly 12, through the flexible printed circuit board 118, to the printed circuit board 116.

Figure 3:
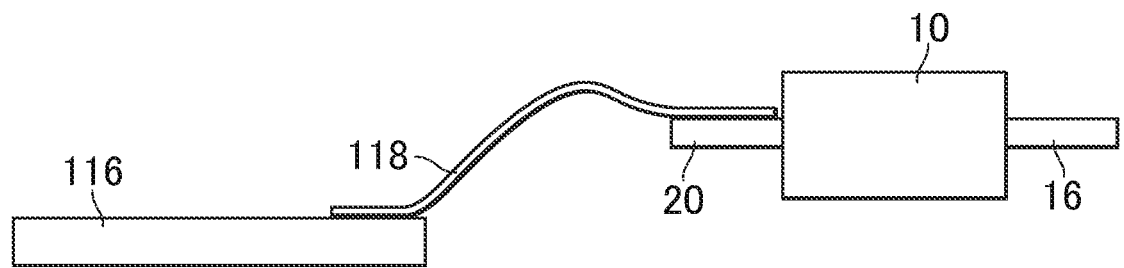
FIG. 3 is a schematic view of a transmitter optical subassembly, a printed circuit board, and a flexible printed circuit board.

FIG. 3 is a schematic view of the transmitter optical subassembly 10, the printed circuit board 116, and the flexible printed circuit board 118. The transmitter optical subassembly 10 is connected to one edge of the flexible printed circuit board 118. The flexible printed circuit board 118 has another edge overlapped with and electrically connected to the printed circuit board 116.

Figure 4:
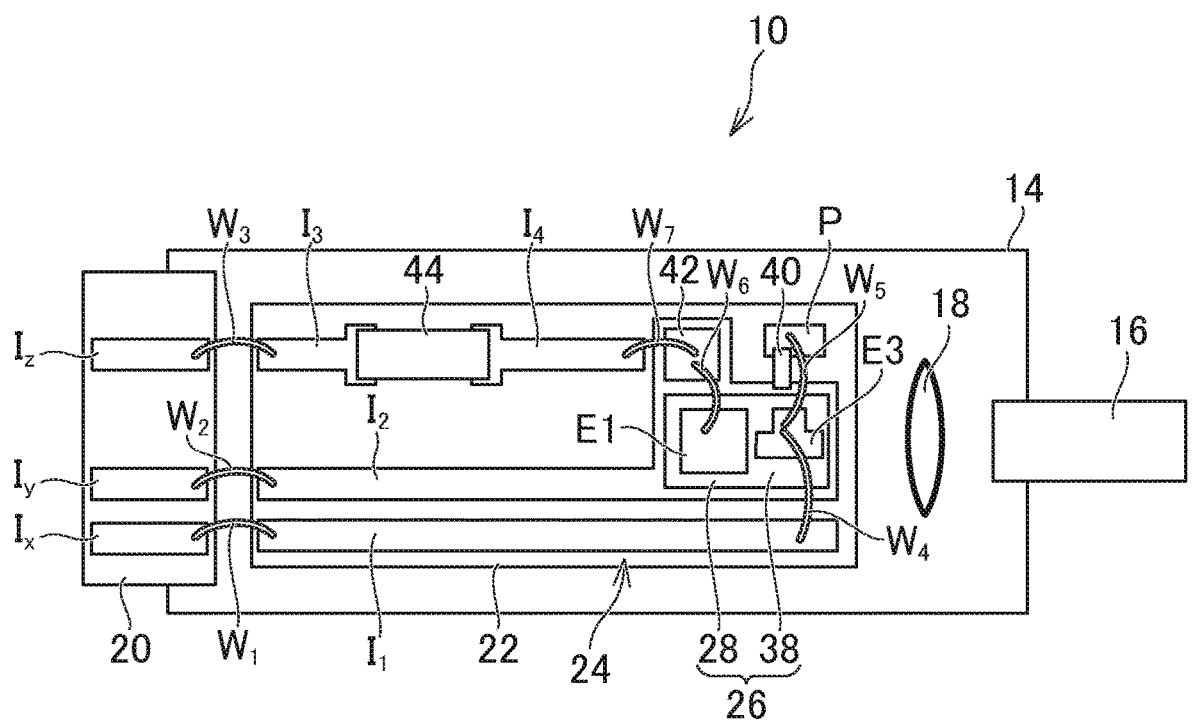
FIG. 4 is a plan view of the transmitter optical subassembly in the first embodiment.

FIG. 4 is a plan view of the transmitter optical subassembly 10 in the first embodiment. The transmitter optical subassembly 10 has a housing 14, to which is attached a receptacle 16 with an optical fiber 120 in FIG. 2 connected thereto. The housing 14 has a lens 18, which condenses light to enter the optical fiber 120. The housing 14 has a feedthrough 20 attached thereto for being connected to the flexible printed circuit board 118 in FIG. 3. The feedthrough 20 has traces Ix, Iy, Iz.

The transmitter optical subassembly 10 has a submount 22. The submount 22 includes a substrate formed from insulation material such as aluminum nitride and an interconnect pattern 24. The submount 22 may be thermally controllable with a thermoelectric element such as an unillustrated Peltier element. The interconnect pattern 24 has a pair of traces $I_1$, $I_2$ connected to a pair of respective traces Ix, Iy of the feedthrough 20, constituting a differential transmission line. For the connection, wires W1, W2 are used. The feedthrough 20 has another trace Iz connected to another trace $I_3$ of the interconnect pattern 24 through a wire W3. The submount 22 has a modulator integrated laser 26 mounted thereon. The modulator integrated laser 26 is electrically connected to the interconnect pattern 24.

Figure 5:
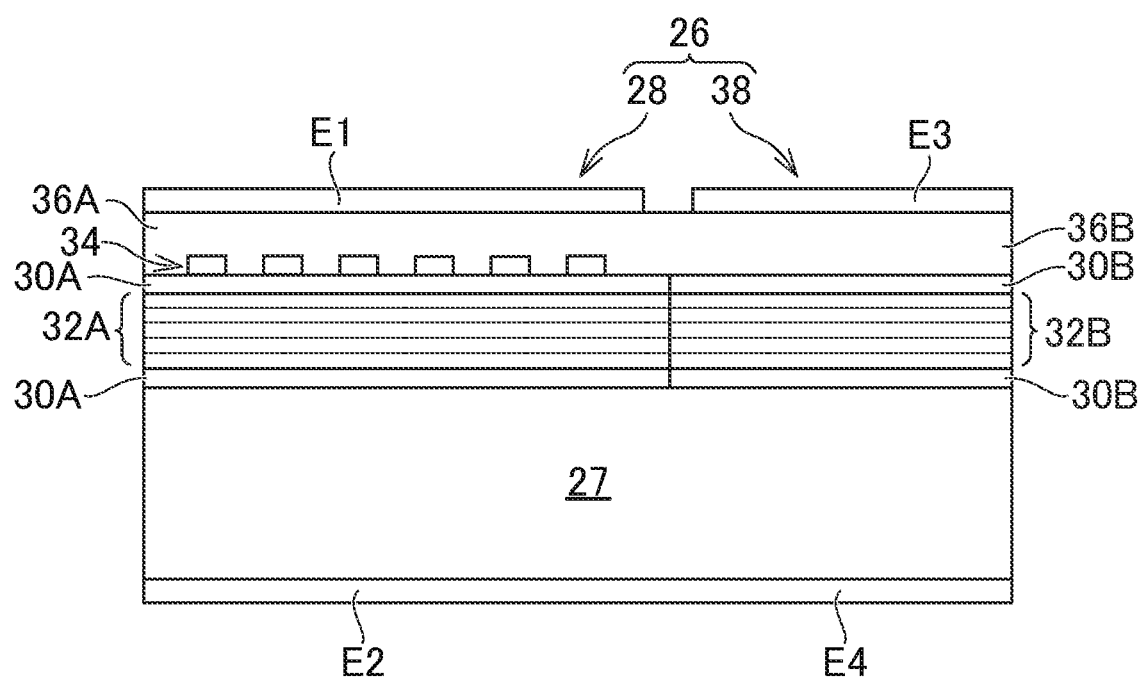
FIG. 5 is a longitudinal sectional view of a modulator integrated laser.

FIG. 5 is a longitudinal sectional view of the modulator integrated laser 26. The modulator integrated laser 26 has configuration where elements are formed in a semiconductor substrate 27. The semiconductor substrate 27 is an n-type InP substrate. The modulator integrated laser 26 has a laser portion 28 for emitting light. The laser portion 28 has a multiple quantum well (MQW) 32A interposed between separated confinement heterostructure (SCH) layers 30A, on the semiconductor substrate 27. The upper SCH layer 30A has a grating layer 34 formed thereon, covered with a clad layer 36A. The laser portion 28 has a first electrode E1 (e.g. anode) and a second electrode E2 (e.g. cathode), for applying a direct current voltage. The laser portion 28 may be a distributed Bragg reflector (DBR) or a distributed feedback (DFB). The modulator integrated laser 26 has a modulation portion 38 for modulating light by an electric field absorption effect. The modulation portion 38 has a multiple quantum well (MQW) 32B interposed between SCH layers 30B, on the semiconductor substrate 27. The upper SCH layer 30B is covered with a clad layer 36B. The clad layers 36A, 36B in the embodiment are the same but may be different from each other. The modulation portion 38 has a third electrode E3 (e.g. anode) and a fourth electrode E4 (e.g. cathode), for applying an alternate current voltage.

The laser portion 28 and the modulation portion 38 are integrated in the same semiconductor substrate 27, with the second electrode E2 and the fourth electrode E4 electrically connected to each other. The integrated second electrode E2 and fourth electrode E4 may be opposed to the trace $I_2$ in FIG. 4 and connected to each other. Alternatively, the second electrode E2 and the fourth electrode E4 may be separate. The trace $I_1$ is electrically connected to the third electrode E3 of the modulation portion 38. For the connection, a wire W4 is used. The third electrode E3 and the fourth electrode E4 are connected to the pair of respective traces $I_1$, $I_2$.

FIG. 4 illustrates that the interconnect pattern 24 on the submount 22 has a pad P. The pad P and the trace $I_2$ are connected to each other through a matching resistor 40 for impedance matching. The pad P is electrically connected to the third electrode E3 of the modulation portion 38 through a wire W5. This makes the matching resistor 40 connected in parallel to the modulation portion 38.

A bypass condenser 42 is mounted on the trace $I_2$ with its one electrode (not shown) conducted thereto. The bypass condenser 42 has another electrode connected to the first electrode E1 of the laser portion 28 through a wire W6. This makes the bypass condenser 42 connected in parallel to the laser portion 28, releasing alternate current components of voltage applied to the laser portion 28, although the bypass condenser 42 is optional.

The transmitter optical subassembly 10 has an impedance element 44. The impedance element 44 is mounted on the submount 22. The impedance element 44 is connected between a pair of traces $I_3$, $I_4$ of the interconnect pattern 24. The trace $I_4$ is connected to an electrode of the bypass condenser 42 through a wire W7. This makes the impedance element 44 connected in series to the bypass condenser 42 and connected in series to the laser portion 28 as well. The impedance element 44 and the traces $I_3$, $I_4$ may be connected to each other through a wire.

Figure 6:
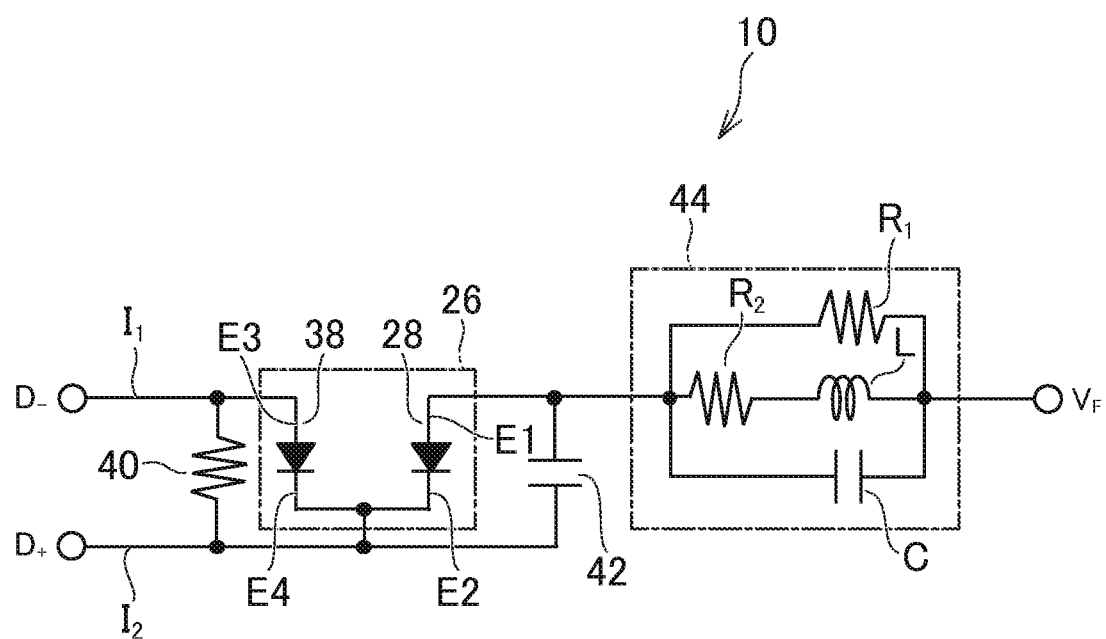
FIG. 6 is a diagram of an equivalent circuit of the transmitter optical subassembly.

FIG. 6 is a diagram of an equivalent circuit of the transmitter optical subassembly 10. The impedance element 44 has inductance L and capacitance C connected in parallel, constituting a resonance circuit. Still, the impedance element 44 has first resistance $R_1$ connected in parallel to each of the inductance L and the capacitance C, and has second resistance $R_2$ connected in series to the inductance L.

The pair of traces $I_1$, $I_2$ receives respective high frequency signals $D_-$, $D_+$ input thereto for differential signal transmission. The high frequency signals $D_-$, $D_+$ are applied to the third electrode E3 and the fourth electrode E4 of the modulation portion 38, respectively (reverse bias). The first electrode E1 of the laser portion 28 receives voltage $V_F$ applied thereto, which is higher than voltage of the high frequency signal $D_+$. The second electrode E2 of the laser portion 28 receives the high frequency signal $D_+$ input thereinto, due to an electrical connection with the fourth electrode E4. This makes the laser portion 28 receive voltage including alternate current components. The alternate current components are apt to go through the bypass condenser 42, rather reducing a flow into the laser portion 28. The embodiment illustrates that the impedance element 44 is connected in series to the first electrode E1, further suppressing the flow of the alternate current into the laser portion 28.

Figure 7:
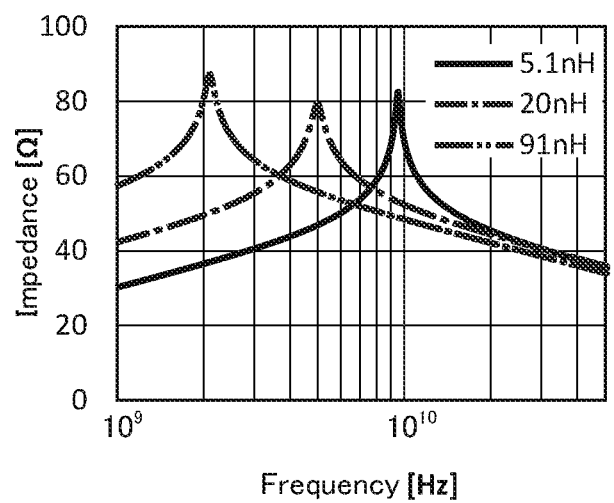
FIG. 7 is a diagram to show a characteristic (relation between frequency and impedance) of an impedance element.

FIG. 7 is a diagram to show a characteristic (relation between frequency and impedance) of the impedance element 44. The impedance element 44 has a self-resonant characteristic of exhibiting the highest impedance at its self-resonant frequency. Described herein are examples of the impedance element 44 having inductance L of 5.1 nH, 20 nH, and 91 nH. With the inductance L being 5.1 nH, the impedance achieves its peak at the self-resonant frequency of 9.5 GHz. Accordingly, the impedance element 44 (L=5.1 nH) least conducts a high frequency signal of 9.5 GHz.

Figure 8:
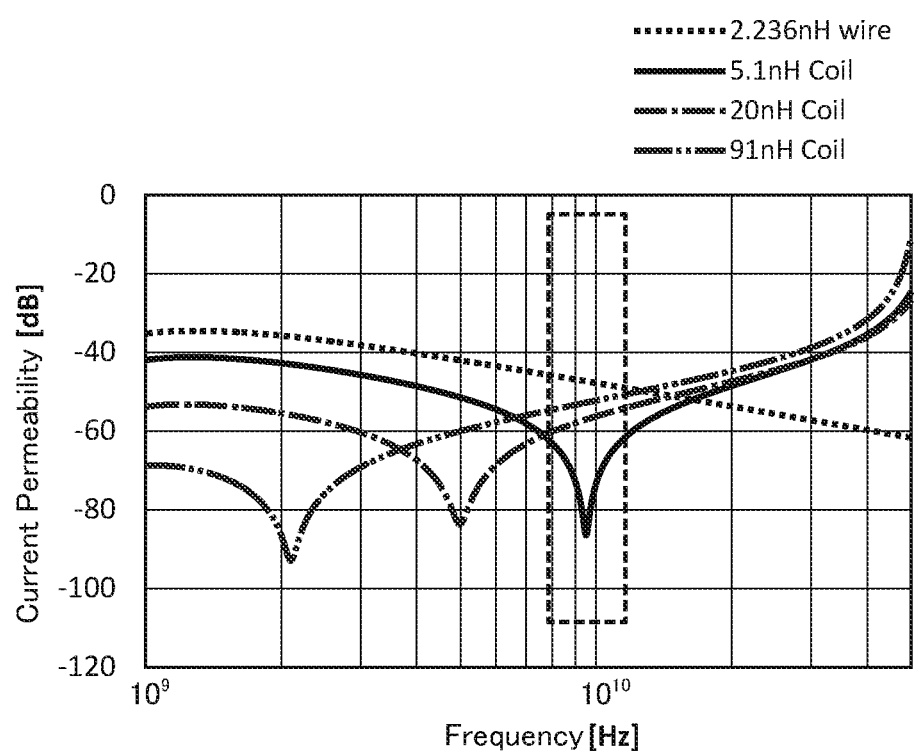
FIG. 8 is a diagram to show a characteristic (relation between frequency and current permeability) of a laser portion connected in series to the impedance element.

FIG. 8 is a diagram to show a characteristic (relation between frequency and current permeability) of the laser portion 28 connected in series to the impedance element 44. This makes it clear that the laser portion 28 specifically connected in series to the impedance element 44 least conducts the alternate current at the self-resonant frequency. The inductance L of 2.236 nH is given for a wire used instead of the impedance element 44, showing no self-resonant characteristic. The wire herein is an arc-shaped wire connecting an interconnect pattern, like the wire W3 in FIG. 4.

Figure 9:
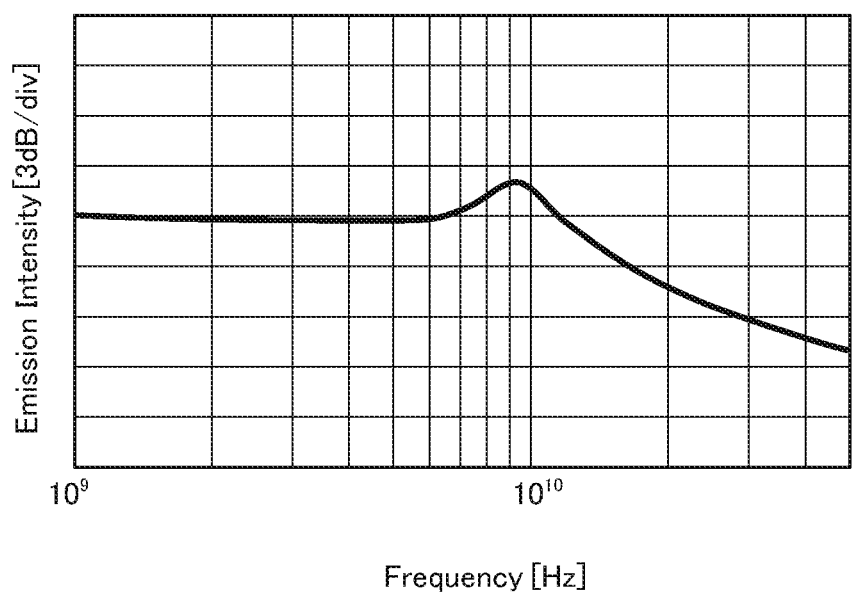
FIG. 9 is a diagram to show a characteristic (relation between frequency and emission intensity) of the laser portion.

FIG. 9 is a diagram to show a characteristic (relation between frequency and emission intensity) of the laser portion 28. The laser portion 28 has a characteristic of exhibiting the highest emission intensity at a relaxation oscillation frequency. To keep output of the laser portion 28 constant, any alternate current components at a frequency close to the relaxation oscillation frequency should not pass the laser portion 28. For example, the self-resonant frequency and the relaxation oscillation frequency should make a difference of 10% or less of the self-resonant frequency as shown by an enclosing dotted line in FIG. 8.

Figure 10:
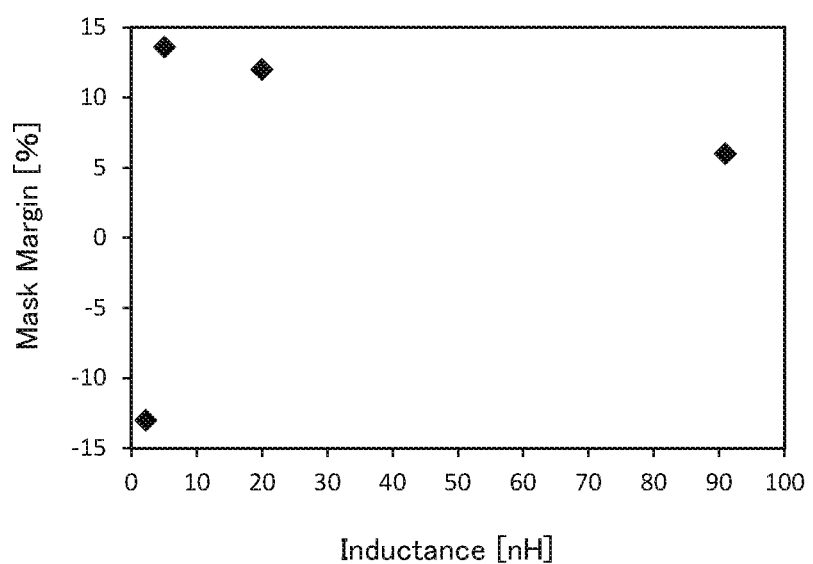
FIG. 10 is a diagram to show a characteristic (relation between inductance and a mask margin) of the impedance element.

FIG. 10 is a diagram to show a characteristic (relation between inductance L and a mask margin) of the impedance element 44. The mask margin shows how large a shape in an eye pattern is, in contrast with a reference shape, to evaluate quality of digital signals. The larger, the higher the quality is. With the wire used to have inductance L of 2.236 nH, the mask margin is very low. By contrast, with the impedance element 44 arranged therein, a mask margin characteristic greatly improves, compared with the wire, irrespective of the inductance L. Specifically, with the impedance element 44 used therein to have the inductance L of 5.1 nH, where a resonance peak is made at the relaxation oscillation frequency of the laser portion 28, the highest mask margin is presented, showing an excellent characteristic.

Second Embodiment

Figure 11:
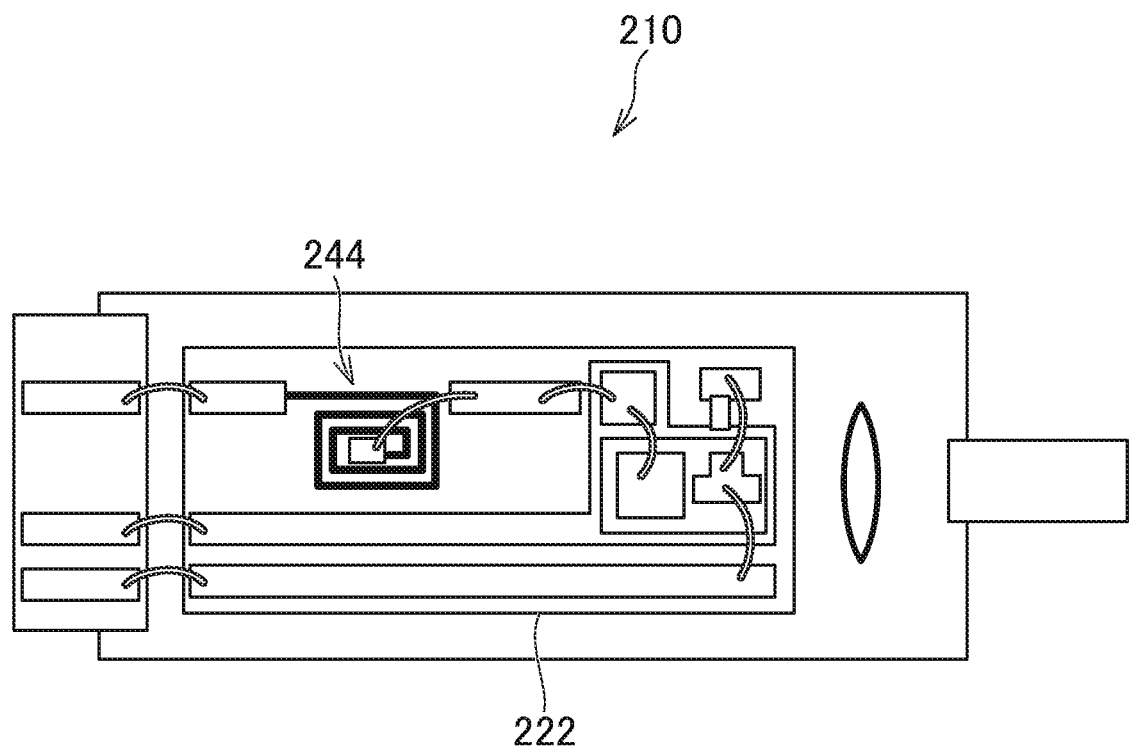
FIG. 11 is a plan view of a transmitter optical subassembly in a second embodiment.

FIG. 11 is a plan view of a transmitter optical subassembly 210 in a second embodiment. The embodiment is different from the first embodiment in the impedance element 244. The impedance element 244 is a planar coil on the submount 222, consisting of a spiral-shaped trace. The impedance element 244 may have its whole portion curved or may have a straight-line portion and a curvature portion as shown in FIG. 11. Any other matters can be explained by reference to the first embodiment.

Third Embodiment

Figure 12:
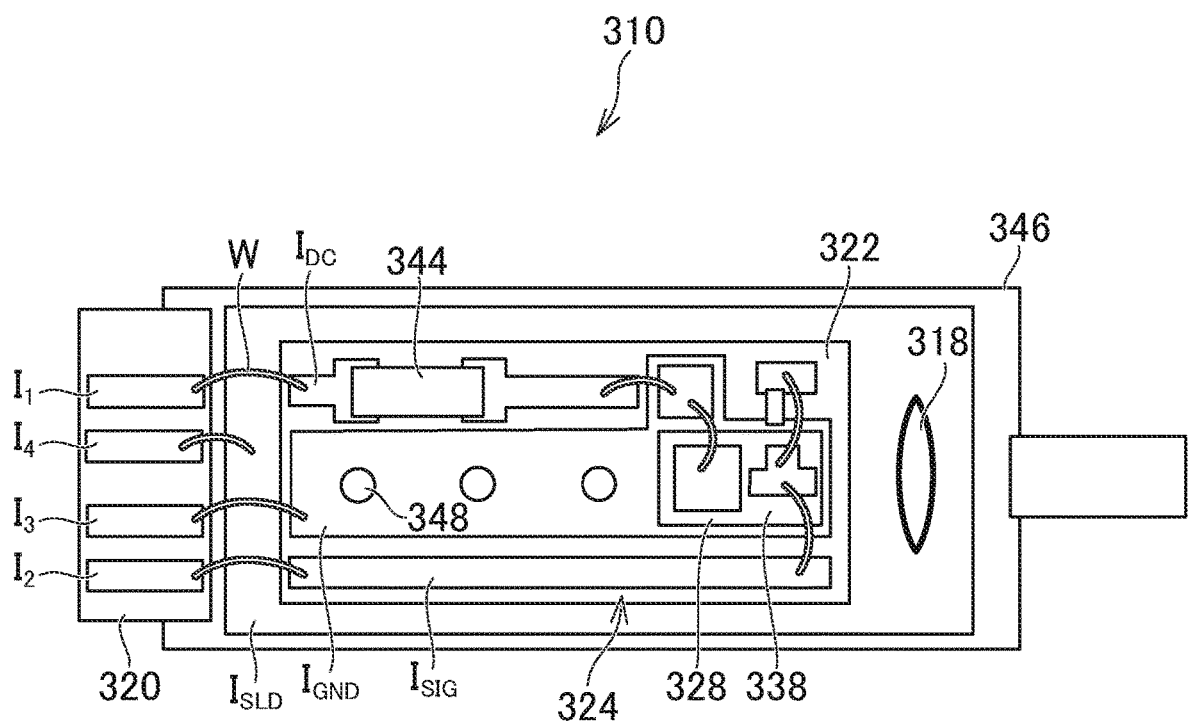
FIG. 12 is a plan view of a transmitter optical subassembly in a third embodiment.

FIG. 12 is a plan view of the transmitter optical subassembly 310 in a third embodiment. The embodiment is different from the first embodiment in application of single-ended transmission. The submount 322 and the lens 318 are on a base 346. The base 346 is made from conductive material such as CuW and is covered with Au.

The interconnect pattern 324 of the submount 322 includes a DC trace $I_{DC}$ for applying a direct current voltage to the laser portion 328, a signal trace $I_{SIG}$ for inputting high frequency signals to the modulation portion 338, and a GND trace $I_{GND}$ for commonly grounding the laser portion 328 and the modulation portion 338. The submount 322 on its back has an unillustrated ground plane, which is electrically connected to the GND trace $I_{GND}$ through a via 348. An unillustrated ground plane is electrically connected to a surface pattern $I_{SLD}$ covered with Au in the base 346. The feedthrough 320 has traces $I_1, I_2, I_3, I_4$, which are connected to the DC trace $I_{DC}$, the signal trace $I_{SIG}$, the GND trace $I_{GND}$, and the surface pattern $I_{SLD}$, respectively, through respective wires W.

Providing the impedance element 344 in a single-ended transmission can minimize an impact on the laser portion 328 by high frequency signals input to the modulation portion 338. Any other matters can be explained by reference to the first embodiment.

Fourth Embodiment

Figure 13:
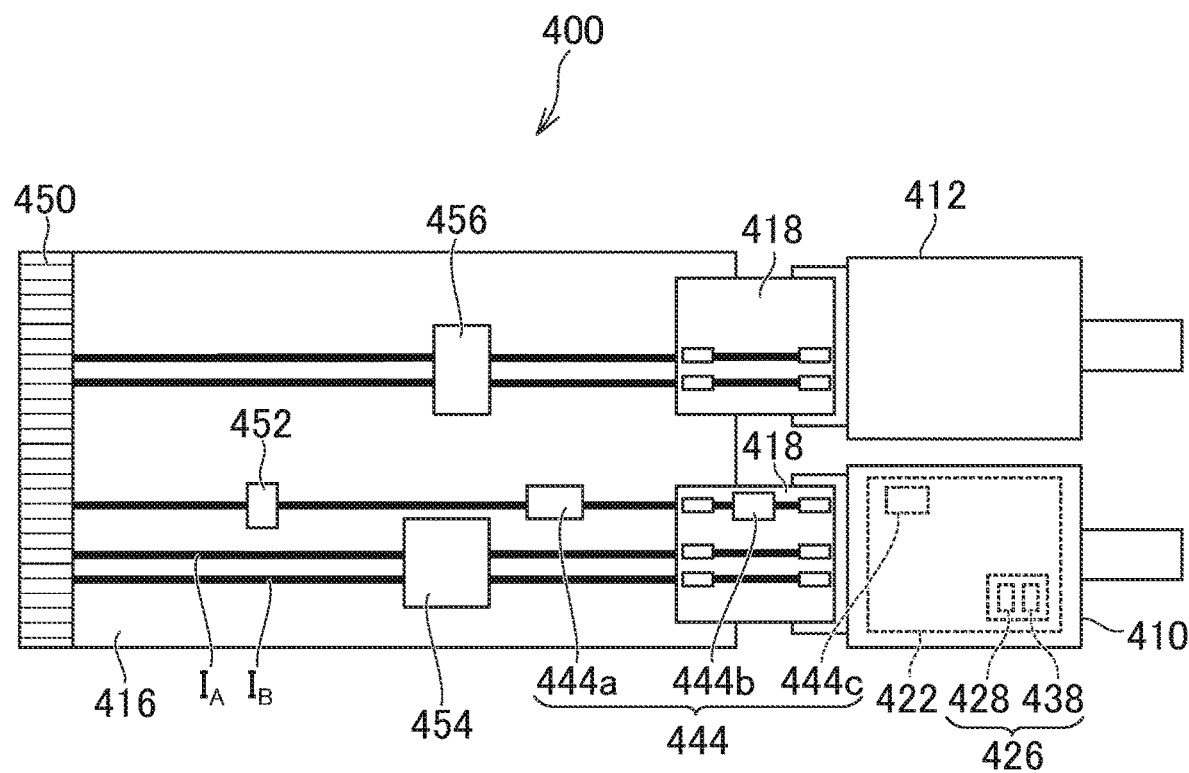
FIG. 13 is a plan view of an optical module in a fourth embodiment.

FIG. 13 is a plan view of the optical module 400 in a fourth embodiment. The optical module 400 has the transmitter optical subassembly 410 and the receiver optical subassembly 412, each of which is connected to the printed circuit board 416 through the flexible printed circuit board 418. The modulator integrated laser 426 included in the transmitter optical subassembly 410 is electrically connected to the flexible printed circuit board 418. The printed circuit board 416 is equipped with an edge connector 450.

The impedance element 444 consists of components 444a, 444b, 444c. At least one component 444a is mounted on the printed circuit board 416. At least one component 444b is mounted on the flexible printed circuit board 418. Still, at least one of component 444c may be inside the transmitter optical subassembly 410 (e.g. on the submount 422). The components 444a, 444b, 444c are connected in series and have a characteristic of the impedance element 444 as a whole.

The printed circuit board 416 has an integrated circuit chip 452 mounted thereon, for driving the laser portion 428. The impedance element 444 is interposed in series between the integrated circuit chip 452 and the laser portion 428. The integrated circuit chip 452 is for controlling a power source voltage input from the edge connector 450, to generate a desired current, and passing current through the laser portion 428 inside the transmitter optical subassembly 410.

The printed circuit board 416 has an integrated circuit chip 454 mounted thereon and electrically connected to a pair of traces $I_A, I_B$ constituting a differential transmission line, for driving the modulation portion 438. Electric high frequency signals (differential signals) for communication, input from the edge connector 450, go through the integrated circuit chip 454 and through the flexible printed circuit board 418, and come to the transmitter optical subassembly 410.

The receiver optical subassembly 412 is for converting optical high frequency signals into electric high frequency signals, and outputting them to the printed circuit board 416 through the flexible printed circuit board 418. The output electric high frequency signals are, through the integrated circuit chip 456 for clock/data recovery, output to the edge connector 450 and sent to a host device. Any other matters can be explained by reference to the first embodiment. As mentioned above, one or more impedance elements may be arranged anywhere between the integrated circuit chip 452 and the laser portion 428.

Fifth Embodiment

Figure 14:
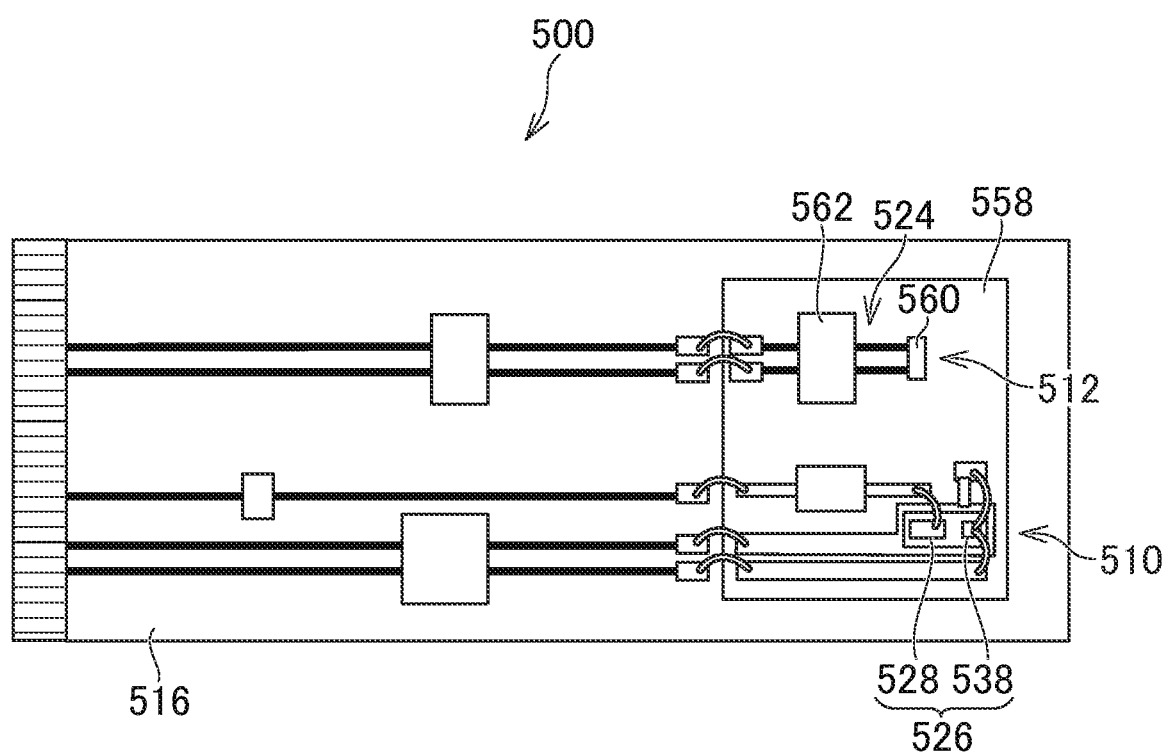
FIG. 14 is a plan view of an optical module in a fifth embodiment.

FIG. 14 is a plan view of the optical module 500 in a fifth embodiment. The optical module 500 has the transmitter optical subassembly 510 and the receiver optical subassembly 512, each of which is not independently packaged. The modulator integrated laser 526 (laser portion 528 and modulation portion 538) is mounted on a ceramic substrate 558 with the interconnect pattern 524. The ceramic substrate 558 is mounted on the printed circuit board 516. The light-receiving element 560 is mounted junction-down on the ceramic substrate 558. The electric high frequency signals, converted by the light-receiving element 560, are amplified by an amplifier integrated circuit chip 562 on the ceramic substrate 558. The interconnect pattern 524 may be formed on the printed circuit board 516, without the ceramic substrate 558, and the modulator integrated laser 526 may be mounted directly on the printed circuit board 516. Any other matters can be explained by reference to the first embodiment.

While there have been described what are at present considered to be certain embodiments, it will be understood that various modifications may be made thereto, and it is intended that the appended claims cover all such modifications as fall within the true spirit and scope of the invention.

What is claimed is:

1. A transmitter optical subassembly comprising:
   a modulator integrated laser having a laser portion for emitting light and a modulation portion for modulating the light by an electric field absorption effect, the modulator integrated laser having a semiconductor substrate of a conductivity type in which the laser portion and the modulation portion are integrated; and
   an impedance element with inductance and capacitance connected in parallel, the impedance element having a self-resonant characteristic exhibiting the highest impedance at a self-resonant frequency,
   wherein
   the laser portion has a first electrode and a second electrode for a direct current voltage to be applied therebetween,
   the modulation portion has a third electrode and a fourth electrode for an alternate current voltage to be applied therebetween,
   the second electrode and the fourth electrode are electrically connected to each other through the semiconductor substrate, and
   the impedance element is connected in series to the first electrode to minimize a flow of an alternate current.

2. The transmitter optical subassembly according to claim 1, wherein
   the laser portion has a characteristic exhibiting the highest emission intensity at a relaxation oscillation frequency, and
   the self-resonant frequency and the relaxation oscillation frequency make a difference of 10% or less of the self-resonant frequency.

3. The transmitter optical subassembly according to claim 1, further comprising a pair of traces for a differential transmission line,
   wherein the third electrode and the fourth electrode are connected to the pair of respective traces.

4. The transmitter optical subassembly according to claim 1, further comprising a bypass condenser connected in parallel to the laser portion.

5. The transmitter optical subassembly according to claim 1, wherein
   the impedance element has first resistance connected in parallel to each of the inductance and the capacitance, and
   the impedance element has second resistance connected in series to the inductance.

6. The transmitter optical subassembly according to claim 1, wherein the impedance element consists of some components.

7. The transmitter optical subassembly according to claim 1, further comprising a submount,
wherein the modulator integrated laser and the impedance element are mounted on the submount.

8. An optical module comprising:
the transmitter optical subassembly according to claim 1; and
a receiver optical subassembly.

9. An optical module comprising:
the transmitter optical subassembly according to claim 1;
a printed circuit board; and
a receiver optical subassembly,
wherein
at least a part of the impedance element is mounted on the printed circuit board.

10. The optical module according to claim 9, further comprising a flexible printed circuit board connected to the printed circuit board,
wherein the flexible printed circuit board is electrically connected to the modulator integrated laser.

* * * * *